(12) United States Patent
Huang et al.

(10) Patent No.: US 11,362,589 B2
(45) Date of Patent: Jun. 14, 2022

(54) FLYING CAPACITOR CONVERTER

(71) Applicant: DELTA ELECTRONICS, INC., Taoyuan (TW)

(72) Inventors: Wen-Yu Huang, Taoyuan (TW); Wei-Lun Hsin, Taoyuan (TW); Xin-Hung Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 138 days.

(21) Appl. No.: 16/868,873

(22) Filed: May 7, 2020

(65) Prior Publication Data

US 2021/0067039 A1 Mar. 4, 2021

Related U.S. Application Data

(60) Provisional application No. 62/892,843, filed on Aug. 28, 2019.

(51) Int. Cl.
*H02M 3/158* (2006.01)
*H01L 29/866* (2006.01)
(Continued)

(52) U.S. Cl.
CPC .......... *H02M 3/158* (2013.01); *H01L 29/866* (2013.01); *H02H 9/04* (2013.01); *H02M 1/08* (2013.01);
(Continued)

(58) Field of Classification Search
CPC .... H02M 1/0003; H02M 1/0095; H02M 1/08; H02M 1/32; H02M 1/325; H02M 1/346; H02M 1/36; H02M 3/07; H02M 3/158; H02M 3/1584; H02M 7/4833; H02M 7/4837; H01L 29/866; H02H 9/04; Y02B 70/10
See application file for complete search history.

(56) References Cited

U.S. PATENT DOCUMENTS 8,743,567 B2 * 6/2014 Singnurkar ........... H02M 3/158
363/24
10,985,653 B1 * 4/2021 Cai .......................... H02M 1/08
(Continued)

FOREIGN PATENT DOCUMENTS

CN 108923632 A 11/2018
CN 109039061 12/2018
(Continued)

*Primary Examiner* — Matthew V Nguyen
(74) *Attorney, Agent, or Firm* — Muncy, Geissler, Olds & Lowe, P.C.

(57) ABSTRACT

A flying capacitor converter includes an inductor, a first switch and a second switch, a first diode and a second diode, a first capacitor and a second capacitor, a flying capacitor, a third diode and a third capacitor, a fourth diode, and a fifth diode. The inductor is coupled to a first node. The first switch and the second switch are commonly connected to a second node. The first diode and the second diode are commonly connected to a third node. The first capacitor and the second capacitor are commonly connected to a fourth node. The flying capacitor is coupled to the second node and the third node. The third diode and the third capacitor are commonly connected to a fifth node. The fifth diode is coupled to the third node and the fourth node.

8 Claims, 9 Drawing Sheets

(51) Int. Cl.
  *H02H 9/04* (2006.01)
  *H02M 1/08* (2006.01)
  *H02M 1/32* (2007.01)
  *H02M 3/07* (2006.01)
  *H02M 1/00* (2006.01)

(52) U.S. Cl.
  CPC .............. *H02M 1/32* (2013.01); *H02M 3/07* (2013.01); *H02M 1/0003* (2021.05); *H02M 1/325* (2021.05)

(56) References Cited

U.S. PATENT DOCUMENTS

| | | | |
|---|---|---|---|
| 2019/0214904 A1* | 7/2019 | Yu | H02M 3/158 |
| 2019/0341850 A1* | 11/2019 | Macri | H02M 7/4837 |
| 2020/0076301 A1 | 3/2020 | Zhuang et al. | |
| 2020/0076302 A1* | 3/2020 | Zhuang | H02M 1/36 |
| 2020/0336063 A1* | 10/2020 | Petersen | H02M 3/07 |

FOREIGN PATENT DOCUMENTS

| | | | | |
|---|---|---|---|---|
| CN | 110165888 A | | 8/2019 | |
| CN | 111277131 | * | 6/2020 | ............. H02M 1/36 |
| JP | 2014036491 A | | 2/2014 | |
| WO | WO2012140781 A1 | | 10/2012 | |

* cited by examiner

FLYING CAPACITOR CONVERTER

CROSS-REFERENCE TO RELATED APPLICATION

This patent application claims the benefit of U.S. Provisional Patent Application No. 62/892,843, filed Aug. 28, 2019, which is incorporated by reference herein.

BACKGROUND

Technical Field

The present disclosure relates to a flying capacitor converter, and more particularly to charging and circuit protection mechanisms for a flying capacitor converter.

Description of Related Art

The statements in this section merely provide background information related to the present disclosure and do not necessarily constitute prior art.

Please refer to FIG. 1, which shows a circuit diagram of a conventional flying capacitor converter (FCC). The FCC is essentially a DC-to-DC boost converter for stepping up a DC input voltage to a DC output voltage. The FCC includes an inductor L, a first switch S1, a second switch S2, a first diode D1, a second diode D2, a flying capacitor $C_{F1}$, and an output capacitor C. The first switch S1 is coupled in series to the second switch S2, and commonly connected at a node $P_S$. The first diode D1 is coupled in series to the second diode D2, and commonly connected at a node $P_D$. The flying capacitor $C_{F1}$ is coupled between the node $P_S$ and the node $P_D$. In particular, the DC output voltage is controlled by turning on and turning off the first switch S1 and the second switch S2.

A first end of the inductor L is coupled to a positive end of a DC input voltage Vdc, and a second end of the inductor L is coupled to an anode of the first diode D1. The first switch S1 is coupled in series to the second switch S2, and a second end of the first switch S1 and a first end of the second switch S2 are commonly coupled to the node $P_S$. A first end of the first switch S1, the second end of the inductor L, and the anode of the first diode D1 are commonly coupled to a node $P_L$. A second end of the second switch S2 is coupled to a negative end of the DC input voltage Vdc.

The first diode D1 is coupled in series to the second diode D2, and a cathode of the first diode D1 and an anode of the second diode D2 are commonly coupled to a node $P_D$. The flying capacitor $C_{F1}$ is coupled between the node $P_D$ and the node $P_S$. A first end of the output capacitor C is coupled to a cathode of the second diode D2, and a second end of the output capacitor C is coupled to the negative end of the DC input voltage Vdc. An output that is the output capacitor C of the FCC is coupled to a load. The output capacitor C is for illustration only, and may actually consist of multiple capacitors connected in series and/or in parallel.

However, the conventional flying capacitor converter has following disadvantages or problems: (1) the problem of the withstand voltage of the second switch S2, and (2) the problem of the withstand voltage of the second diode D2.

SUMMARY

An object of the present disclosure is to provide a flying capacitor converter to solve the problems of the related art.

In order to achieve the above-mentioned object, the flying capacitor converter receives a DC input voltage and converts the DC input voltage into a DC output voltage. The flying capacitor converter includes an inductor, a first switch and a second switch, a first diode and a second diode, a first capacitor and a second capacitor, a flying capacitor, a third diode and a third capacitor, a fourth diode, and a fifth diode. The inductor is coupled between a positive end of the DC input voltage and a first node. The first switch and the second switch are commonly coupled to a second node, and the first switch is coupled to the first node and the second switch is coupled to a negative end of the DC input voltage. The first diode and the second diode are commonly coupled to a third node, and the first diode is coupled to the first node. The first capacitor and the second capacitor are commonly coupled to a fourth node, and the first capacitor is coupled to the second diode and the second capacitor is coupled to the second switch and the negative end of the DC input voltage. The first capacitor and the second capacitor provide the DC output voltage, and the fourth node is a midpoint of the DC output voltage. The flying capacitor is coupled to the second node and the third node. The third diode and the third capacitor are commonly coupled to a fifth node, and the third diode is coupled to the second node and the third capacitor is coupled to the second switch and the negative end of the DC input voltage. The fourth diode is coupled to the second diode and the fifth node. The fifth diode is coupled to the third node and the fourth node.

In one embodiment, the flying capacitor converter further includes a voltage suppressor. The voltage suppressor is coupled in series to the fifth diode, and the voltage suppressor and the fifth diode are coupled between the third node and the fourth node.

In one embodiment, the voltage suppressor and the fifth diode are commonly coupled to a sixth node, and the voltage suppressor is coupled to the third node and the fifth diode is coupled to the fourth node.

In one embodiment, the flying capacitor converter further includes a first resistor. The first resistor is coupled between the sixth node and a seventh node. The seventh node is a common node of the second diode and the fourth diode.

In one embodiment, when the DC input voltage initially supplies power, the first switch and the second switch are turned off, and the DC input voltage charges the first capacitor and the second capacitor and charges the flying capacitor and the third capacitor so that a voltage ratio between the first switch and the second switch is substantially equal to a voltage ratio between the flying capacitor and the third capacitor.

In one embodiment, an output of the flying capacitor converter is coupled to an output of a second flying capacitor converter, and the second flying capacitor converter converts a second DC input voltage into a second DC output voltage.

In one embodiment, a breakdown voltage of the voltage suppressor is greater than a difference between a maximum ripple voltage of the second capacitor and a minimum ripple voltage of the flying capacitor.

In one embodiment, at a predetermined time before the flying capacitor converter active, the flying capacitor converter provides a control signal with an extremely small duty cycle to the second switch so that the flying capacitor is slowly charged.

In one embodiment, the voltage suppressor is a transient voltage suppressor or a Zener diode.

Accordingly, the flying capacitor converter provides charging and circuit protection mechanisms.

It is to be understood that both the foregoing general description and the following detailed description are exemplary, and are intended to provide further explanation of the present disclosure as claimed. Other advantages and features of the present disclosure will be apparent from the following description, drawings and claims.

BRIEF DESCRIPTION OF DRAWINGS

The present disclosure can be more fully understood by reading the following detailed description of the embodiment, with reference made to the accompanying drawing as follows.

DETAILED DESCRIPTION

Figure 1:
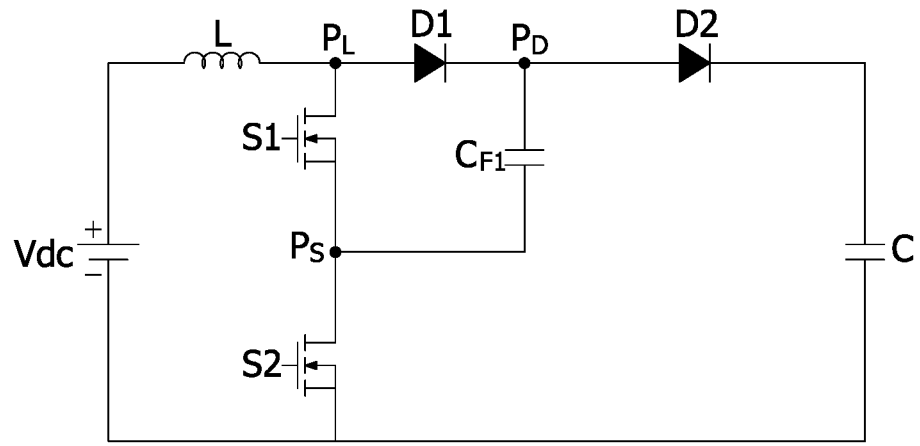
FIG. 1 is a circuit diagram of a conventional flying capacitor converter (FCC).

Reference will now be made to the drawing figures to describe the present disclosure in detail. It will be understood that the drawing figures and exemplified embodiments of present disclosure are not limited to the details thereof.

As mentioned above, the flying capacitor converter of the present disclosure is provided to solve the problems: (1) the problem of the withstand voltage of the second switch S2, and (2) the problem of the withstand voltage of the second diode D2.

(1) the problem of the withstand voltage of the second switch S2: when the DC input voltage Vdc starts to supply power, thereby charging the output capacitor through the inductor L, the first diode D1, and the second diode D2. Since the flying capacitor $C_{F1}$ has no charging path yet, a voltage across the flying capacitor $C_{F1}$ is close to zero, and a voltage across the second switch S2 is close to the magnitude of the DC input voltage Vdc. Therefore, the withstand voltage problem of the second switch S2 will be caused.

Figure 2:
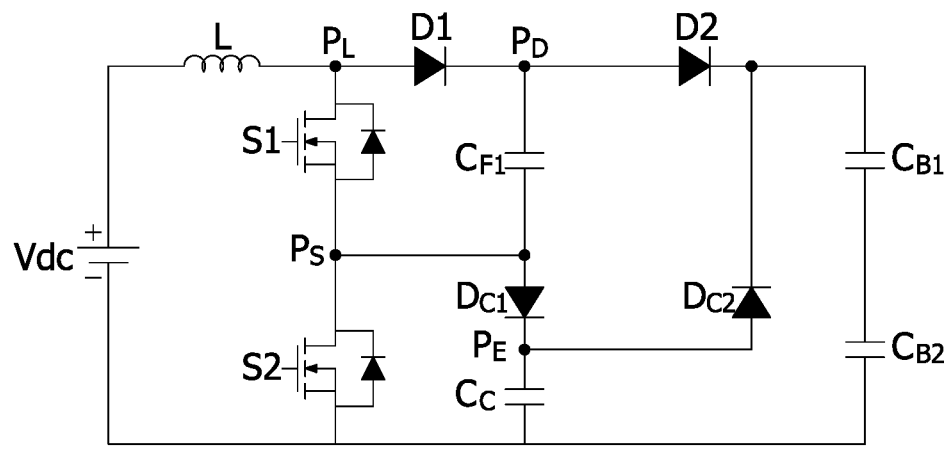
FIG. 2 is a circuit diagram of a first embodiment of an improved FCC.

Please refer to FIG. 2, which shows a circuit diagram of a first embodiment of an improved FCC. In order to solve the withstand voltage problem of the second switch S2 caused by the DC input voltage Vdc starting to supply power, a third capacitor $C_C$, a third diode $D_{C1}$, and a fourth diode $D_{C2}$ are provided. Here, the output capacitor is represented by a first capacitor $C_{B1}$ and a second capacitor $C_{B2}$ connected in series. Specifically, a cathode of the third diode $D_{C1}$ is coupled to an anode of the fourth diode $D_{C2}$ and one end of the third capacitor $C_C$, that is, the third diode $D_{C1}$, the fourth diode $D_{C2}$, and the third capacitor $C_C$ are commonly coupled to a node $P_E$. An anode of the third diode $D_{C1}$ is coupled to the node $P_S$, a cathode of the fourth diode $D_{C2}$ is coupled to the second diode D2 and the first capacitor $C_{B1}$, and the other end of the third capacitor $C_C$ is coupled to the second switch S2 and the second capacitor $C_{B2}$. Therefore, when the DC input voltage Vdc starts to supply power, not only the first capacitor $C_{B1}$ and the second capacitor $C_{B2}$ are charged through the inductor L, the first diode D1, and the second diode D2, but also the third capacitor $C_C$ is charged through the inductor L, the first diode D1, the flying capacitor $C_{F1}$, and the third diode $D_{C1}$. Therefore, an effect of voltage division is provided so that a voltage ratio between the first switch S1 and the second switch S2 is equal to a voltage ratio between the flying capacitor $C_{F1}$ and the third capacitor $C_C$, thereby solving the withstand voltage problem of the second switch S2. Moreover, the fourth diode $D_{C2}$ provides a discharging path when the third capacitor $C_C$ discharges.

Figure 3:
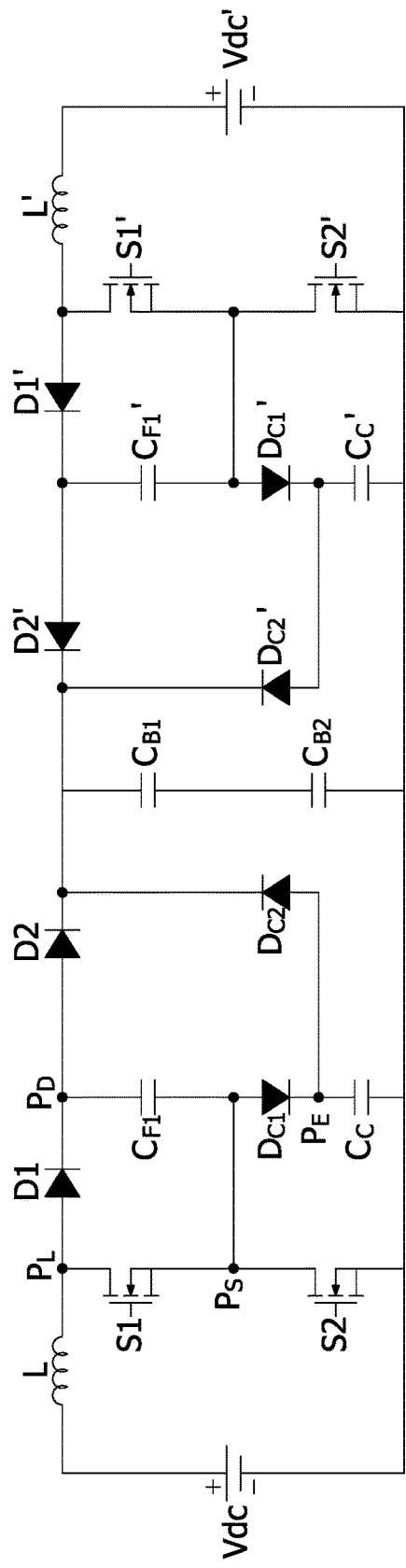
FIG. 3 is a circuit diagram of the first embodiment of the improved FCC used in parallel.

(2) the problem of the withstand voltage of the second diode D2: as shown in FIG. 3, which shows a circuit diagram of the first embodiment of the improved FCC used in parallel. Under the condition that two flying capacitor converters are used in parallel, when the DC input voltage Vdc does not supply power and the other DC input voltage Vdc' (a second DC input voltage) provides a DC high voltage (for example, but not limited to 1500 volts), the sum of the voltage of the first capacitor $C_{B1}$ and the voltage of the second capacitor $C_{B2}$ is equivalent to the magnitude of the DC high voltage. For the second diode D2, it is equivalent to withstand the reverse bias voltage of the DC high voltage, thereby causing the problem of the withstand voltage of the second diode D2. In practical applications, it is not easy to obtain the second diode D2 with such a high withstand voltage. Furthermore, even if a diode with such a high withstand voltage can be obtained for use, or by connecting multiple diodes in series, it will cause the problem with poor efficiency.

Figure 4:
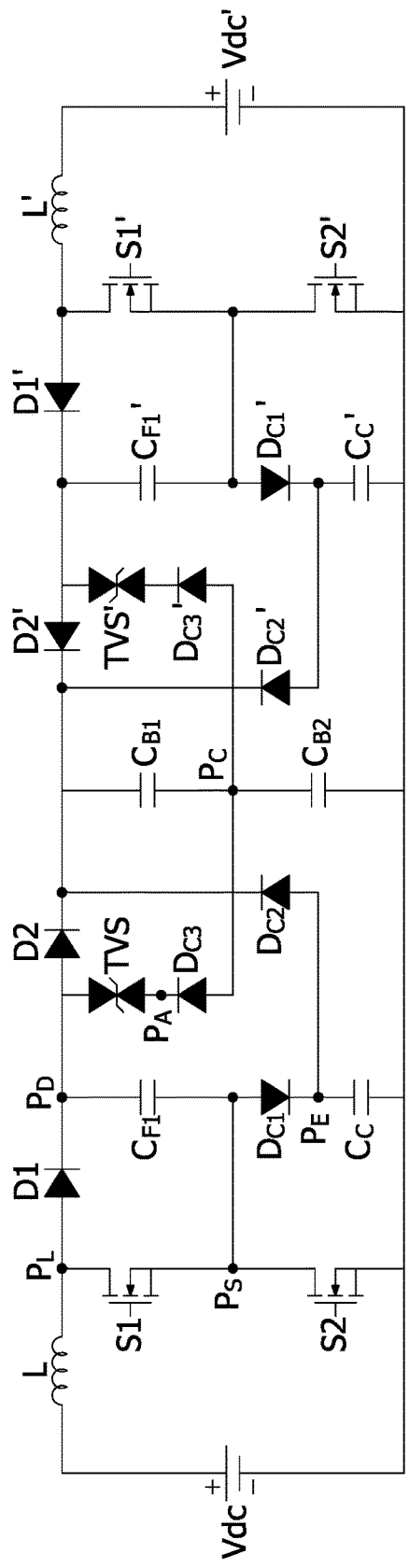
FIG. 4 is a circuit diagram of a second embodiment of the improved FCC.

In order to solve the above-mentioned problem, as shown in FIG. 4, which shows a circuit diagram of a second embodiment of the improved FCC. In order to solve the withstand voltage problem of the second diode D2 caused by the DC input voltage Vdc' providing the DC high voltage but the DC input voltage Vdc supplying no power, a fifth diode $D_{C3}$ and a transient voltage suppressor TVS are provided, and also a fifth diode $D_{C3}$' and a transient voltage suppressor TVS' are provided. Specifically, the transient voltage suppressor TVS is coupled in series to the fifth diode $D_{C3}$, and commonly coupled to a node $P_A$. The other end of the transient voltage suppressor TVS is coupled to the node $P_D$, and an anode of the fifth diode $D_{C3}$ is coupled to a common node $P_C$ between the first capacitor $C_{B1}$ and the second capacitor $C_{B2}$.

When the DC input voltage Vdc does not yet supply power and the DC input voltage Vdc' provides the DC high voltage, the DC high voltage will charge the first capacitor $C_{B1}$ and the second capacitor $C_{B2}$, and therefore a voltage across the second capacitor $C_{B2}$ is approximately equal to half of the DC high voltage. At this condition, a voltage at a midpoint, i.e., the node $P_C$ of the first capacitor $C_{B1}$ and the second capacitor $C_{B2}$ will produce a charging path, and the charging path is provided by the fifth diode $D_{C3}$, the transient voltage suppressor TVS, the flying capacitor $C_{F1}$, the third diode $D_{C1}$, the third capacitor $C_C$, and the second capacitor $C_{B2}$. In particular, an electric potential of the anode of the second diode D2 is about half of the magnitude of the DC high voltage minus the voltage of the transient voltage suppressor TVS. Therefore, the voltage across the second diode D2 is half of the magnitude of the DC high voltage plus the voltage of the transient voltage suppressor TVS, that is, the withstand voltage of the second diode D2 does not need to reach the magnitude of the DC high voltage, thereby solving the problem of the withstand voltage of the second diode D2. In particular, the first capacitor $C_{B1}$ and the second capacitor $C_{B2}$ are not limited to only two independent capacitors, but may also be composed of multiple capacitors, and the node $P_C$ is a voltage midpoint, that is, the voltage of the node $P_C$ is approximately equal to half of the output voltage. The selection of the midpoint can be achieved by selecting the first capacitor $C_{B1}$ and the second capacitor $C_{B2}$ to have the same capacitance value, or controlling the voltage of the node $P_C$ to be equal to half of the output voltage by a power conversion apparatus when the load connected to the output voltage is the power conversion apparatus such as an inverter.

Figure 5A:
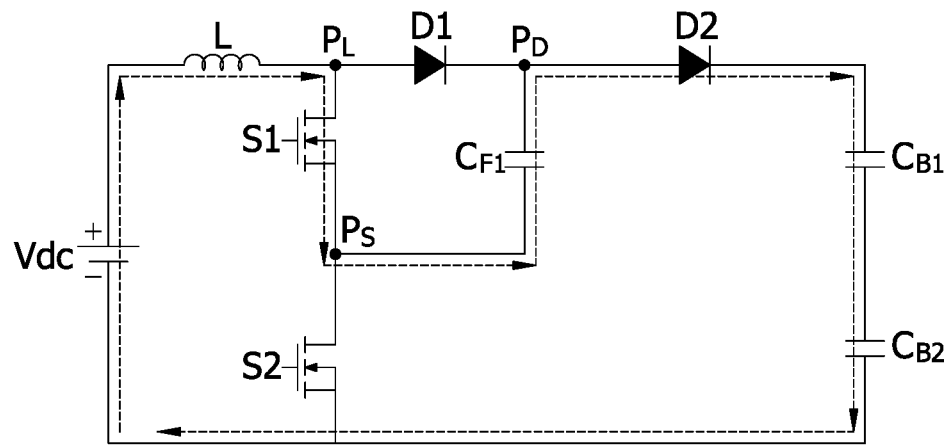
FIG. 5A to FIG. 5D are schematic circuit diagrams of the FCC operating under states of duty cycle less than 0.5.

Please refer to FIG. 5A to FIG. 5D, which show schematic circuit diagrams of the FCC operating under states of duty cycle less than 0.5. The DC output voltage of the flying capacitor converter is controlled by controlling (turning on/off) the first switch S1 and the second switch S2, and therefore four states are implemented as shown in FIG. 5A (the first switch S1 is turned on and the second switch S2 is turned off), in FIG. 5B (the first switch S1 is turned off and the second switch S2 is turned off), in FIG. 5C (the first switch S1 is turned off and the second switch S2 is turned on), and in FIG. 5D (the first switch S1 is turned off and the second switch S2 is turned off).

In the first state, the first switch S1 is turned on and the second switch S2 is turned off as shown in FIG. 5A. When the first switch S1 is turned on, the DC input voltage Vdc charges the inductor L, and a charging path is provided by the DC input voltage Vdc, the inductor L, the first switch S1, the flying capacitor $C_{F1}$, the second diode D2, the first capacitor $C_{B1}$, and the second capacitor $C_{B2}$. The flying capacitor $C_{F1}$ is in a discharged state.

Figure 5B:
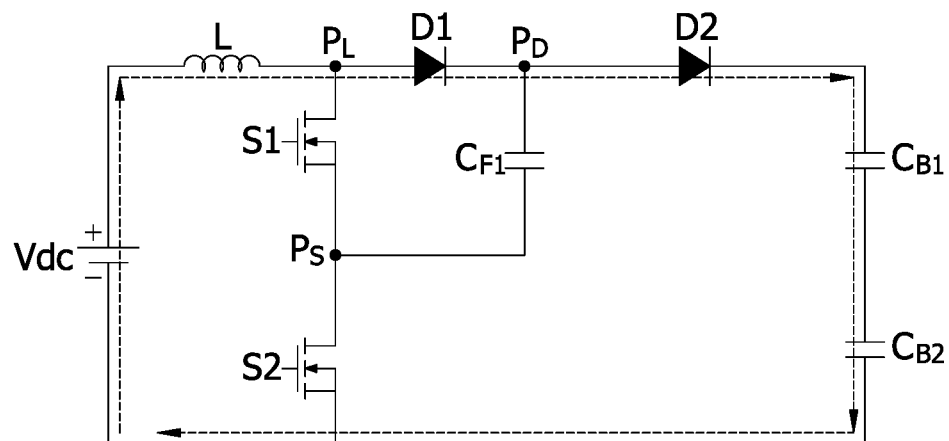

In the second state, the first switch S1 is turned off and the second switch S2 is turned off as shown in FIG. 5B. Since it will continue to keep the current flowing through the inductor L, a freewheel path is provided by the inductor L, the first diode D1, the second diode D2, the first capacitor $C_{B1}$, the second capacitor $C_{B2}$, and the DC input voltage Vdc. In particular, the freewheel path is an energy-releasing path of the inductor L.

Figure 5C:
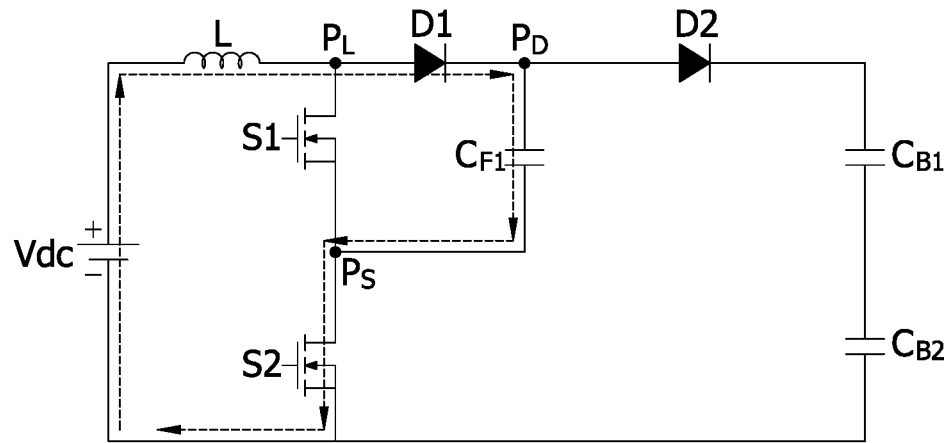

In the third state, the first switch S1 is turned off and the second switch S2 is turned on as shown in FIG. 5C. The DC input voltage Vdc charges the inductor L, and a charging path is provided by the DC input voltage Vdc, the inductor L, the first diode D1, the flying capacitor $C_{F1}$, and the second switch S2. The inductor L and the flying capacitor $C_{F1}$ are in an energy-storing state.

Figure 5D:
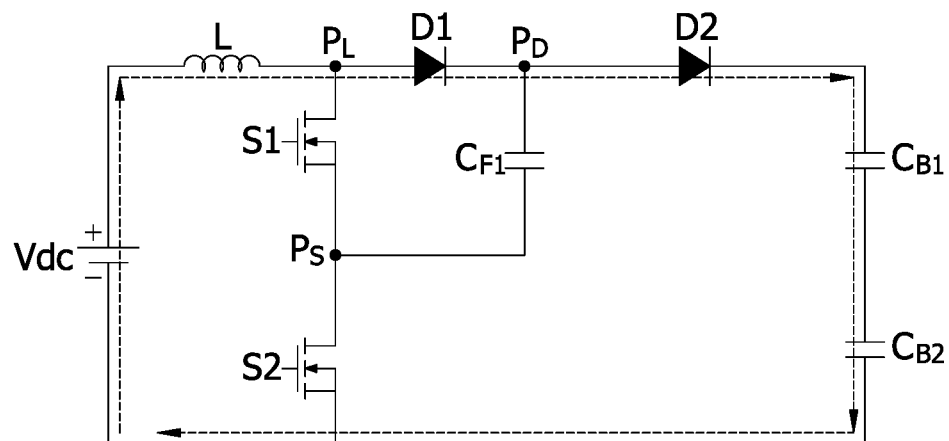

In the fourth state, the first switch S1 is turned off and the second switch S2 is turned off as shown in FIG. 5D. At this condition, the inductor L is in the energy-releasing state, and an energy-releasing path is provided by the inductor L, the first diode D1, the second diode D2, the first capacitor $C_{B1}$, the second capacitor $C_{B2}$, and the DC input voltage Vdc.

Figure 6A:
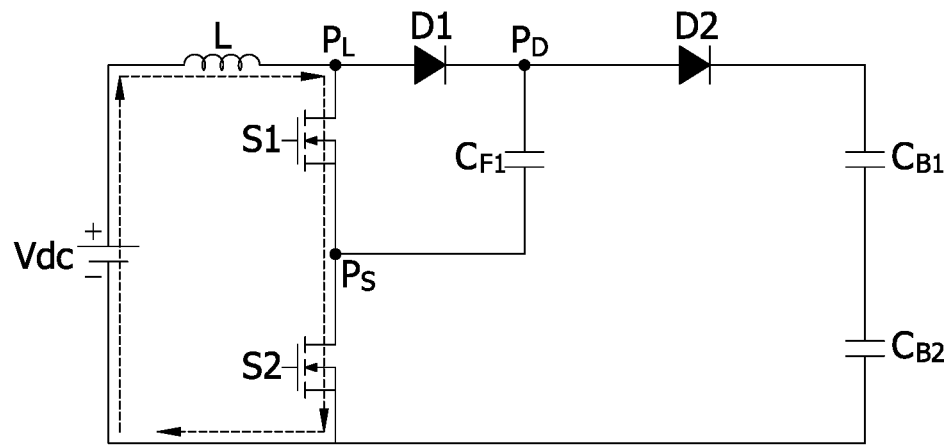
FIG. 6A to FIG. 6D are schematic circuit diagrams of the FCC operating under states of duty cycle greater than 0.5.

Please refer to FIG. 6A to FIG. 6D, which show schematic circuit diagrams of the FCC operating under states of duty cycle greater than 0.5. The DC output voltage of the flying capacitor converter is controlled by controlling (turning on/off) the first switch S1 and the second switch S2, and therefore four states are implemented as shown in FIG. 6A (the first switch S1 is turned on and the second switch S2 is turned on), in FIG. 6B (the first switch S1 is turned off and the second switch S2 is turned on), in FIG. 6C (the first switch S1 is turned on and the second switch S2 is turned on), and in FIG. 6D (the first switch S1 is turned on and the second switch S2 is turned off).

In the first state, the first switch S1 is turned on and the second switch S2 is turned on as shown in FIG. 6A. The DC input voltage Vdc stores energy to the inductor L, and an energy-storing path is provided by the DC input voltage Vdc, the inductor L, the first switch S1, and the second switch S2.

Figure 6B:
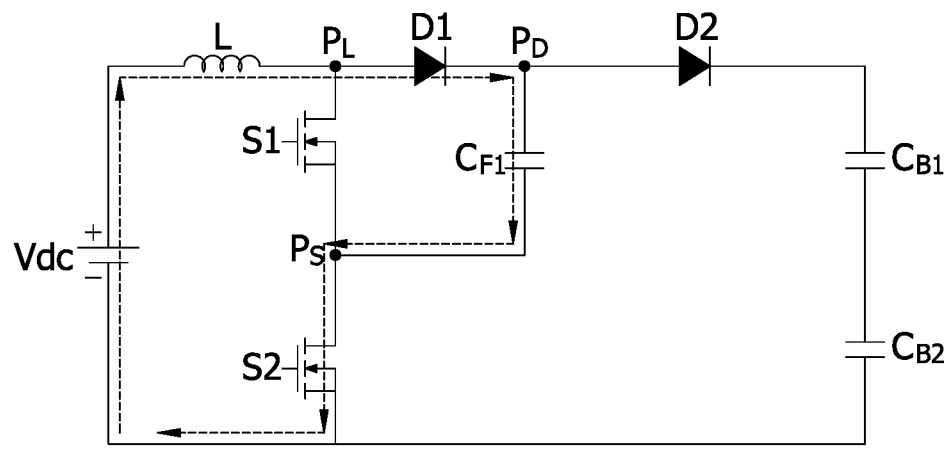

In the second state, the first switch S1 is turned off and the second switch S2 is turned on as shown in FIG. 6B. Since it will continue to keep the current flowing through the inductor L, a freewheel path is provided by the inductor L, the first diode D1, the flying capacitor $C_{F1}$, and the second switch S2.

Figure 6C:
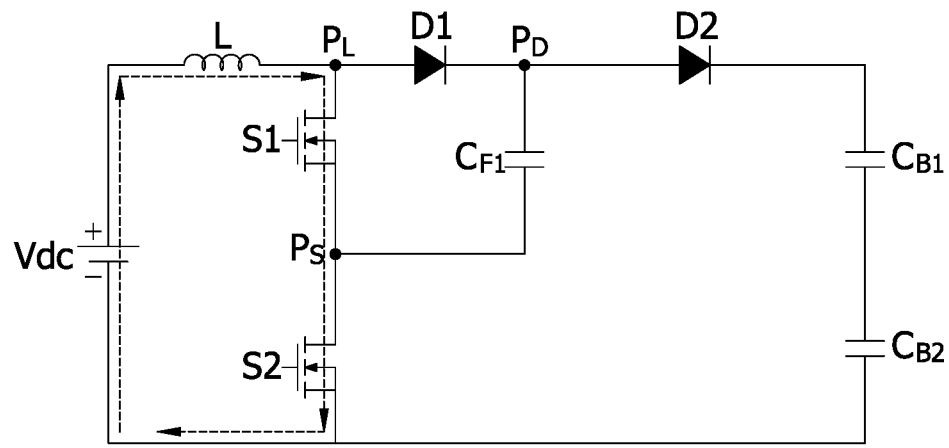

In the third state, the first switch S1 is turned on and the second switch S2 is turned on as shown in FIG. 6C. The DC input voltage Vdc stores energy to the inductor L, and an energy-storing path is provided by the DC input voltage Vdc, the inductor L, the first switch S1, and the second switch S2.

Figure 6D:
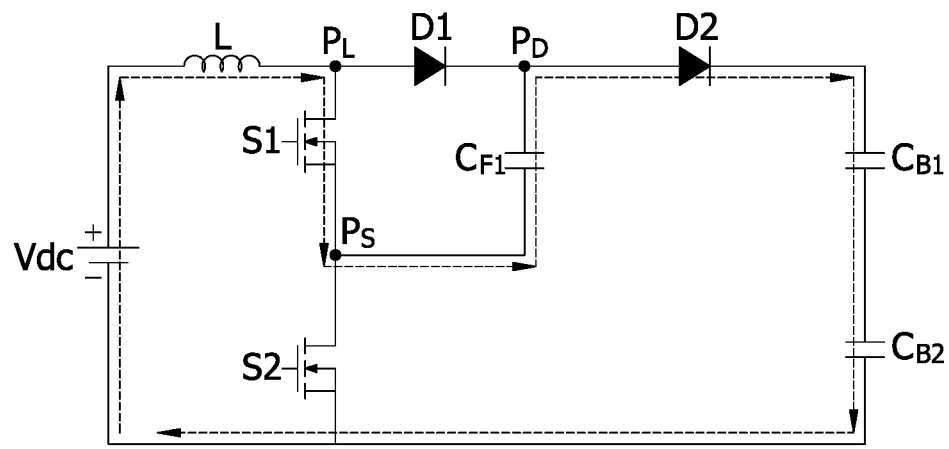

In the fourth state, the first switch S1 is turned on and the second switch S2 is turned off as shown in FIG. 6D. Since it will continue to keep the current flowing through the inductor L, a freewheel path is provided by the inductor L, the first switch S1, the flying capacitor $C_{F1}$, the second diode D2, the first capacitor $C_{B1}$, and the second capacitor $C_{B2}$.

Figure 7:
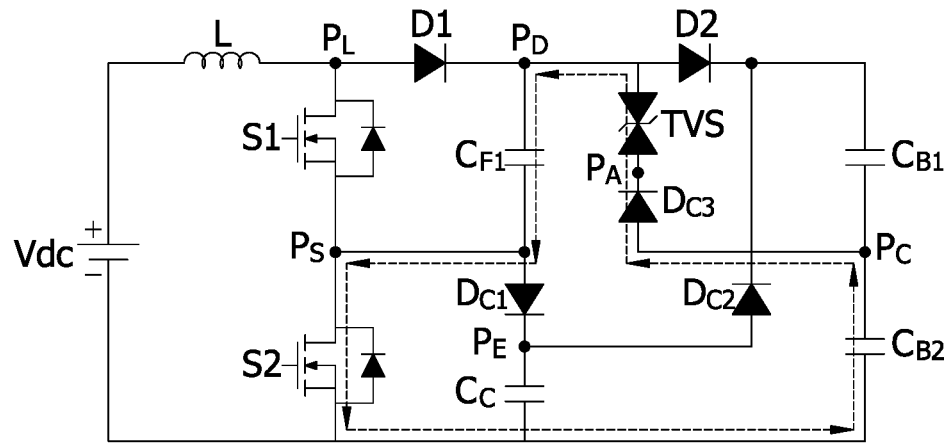
FIG. 7 is a schematic circuit diagram of the FCC operating under unbalanced capacitor voltage.

Please refer to FIG. 7, which shows a schematic circuit diagram of the FCC operating under unbalanced capacitor voltage. Basically, the voltage of the flying capacitor $C_{F1}$ is controlled at half of the sum of the voltage of the first capacitor $C_{B1}$ and the voltage of the second capacitor $C_{B2}$. If the voltage of the first capacitor $C_{B1}$ is equal to the voltage of the second capacitor $C_{B2}$, no large charging current generates. During the operation of the flying capacitor converter, there is voltage ripple on the first capacitor $C_{B1}$ and the second capacitor $C_{B2}$ since the different states alternatively change as mentioned above. When the voltage of the second capacitor $C_{B2}$ is greater than the voltage of the flying capacitor $C_{F1}$, a charging path shown in FIG. 7 is formed. By adding the transient voltage suppressor TVS to the charging path, the sum of the voltage of the flying capacitor $C_{F1}$ and the voltage of the transient voltage suppressor TVS is greater than the voltage of the second capacitor $C_{B2}$ to avoid current flowing through this charging path. Therefore, the voltage selection of the transient voltage suppressor TVS can be determined according to this principle to avoid forming the charging path shown in FIG. 7 due to ripples, thereby protecting the fifth diode $D_{C3}$. Accordingly, it is to avoid excessive current frequently flowing through the fifth diode $D_{C3}$ during the operation of the flying capacitor converter. The connection position of the transient voltage suppressor TVS and the fifth diode $D_{C3}$ is not limited to that shown in FIG. 7, and as long as the two are coupled in series between the node $P_C$ and the node $P_D$.

Figure 8:
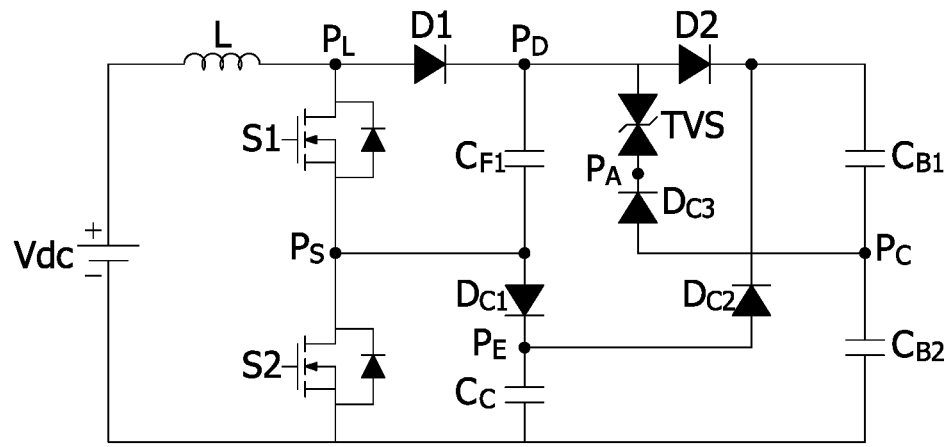
FIG. 8 is a circuit diagram of the flying capacitor converter according to a first preferred embodiment of the present disclosure.
Figure 9:
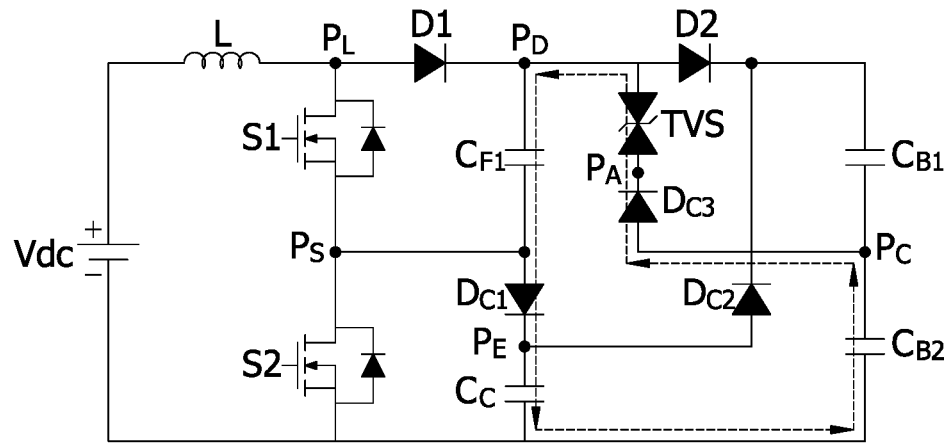
FIG. 9 is a schematic circuit diagram illustrating a protection current of the flying capacitor converter according to the first preferred embodiment of the present disclosure.

Please refer to FIG. 8, which shows a circuit diagram of the flying capacitor converter according to a first preferred embodiment of the present disclosure. When the DC input voltage Vdc starts to supply power, at a predetermined time before the flying capacitor converter activates, that is, at a predetermined time before the first switch S1 and the second switch S2 start to operate shown in FIG. 5A to FIG. 5D or FIG. 6A to FIG. 6D, a control signal with an extremely small duty cycle is provided to the second switch S2 so that the flying capacitor $C_{F1}$ is slowly charged until the sum of the voltage of the flying capacitor $C_{F1}$ and the voltage of the transient voltage suppressor TVS is equal to the voltage of the second capacitor $C_{B2}$.

Please refer to FIG. 8 again, the FCC includes an inductor L, a first switch S1, a second switch S2, a first diode D1, a second diode D2, a third diode $D_{C1}$, a fourth diode $D_{C2}$, a fifth diode $D_{C3}$, a flying capacitor $C_{F1}$, a first capacitor $C_{B1}$, a second capacitor $C_{B2}$, a third capacitor $C_C$, and a transient voltage suppressor TVS. In particular, the transient voltage suppressor TVS may be replaced by a Zener diode.

A first end of the inductor L is coupled to a positive end of a DC input voltage Vdc, and a second end of the inductor L is coupled to an anode of the first diode D1. The first switch S1 is coupled in series to the second switch S2, and a second end of the first switch S1 and a first end of the second switch S2 are commonly coupled to a node $P_S$. A first end of the first switch S1, the second end of the inductor L, and the anode of the first diode D1 are commonly coupled to a node $P_L$. A second end of the second switch S2 is coupled to a negative end of the DC input voltage Vdc.

The first diode D1 is coupled in series to the second diode D2, and a cathode of the first diode D1 and an anode of the second diode D2 are commonly coupled to a node $P_D$. The flying capacitor $C_{F1}$ is coupled between the node $P_D$ and the node $P_S$. The first capacitor $C_{B1}$ is coupled in series to the second capacitor $C_{B2}$. A second end of the first capacitor $C_{B1}$ and a first end of the second capacitor $C_{B2}$ are commonly coupled to a node $P_C$. A first end of the first capacitor $C_{B1}$ is coupled to a cathode of the second diode D2, and a second end of the second capacitor $C_{B2}$ is coupled to a negative end of the DC input voltage Vdc. An output of the FCC, which is the first capacitor $C_{B1}$ and the second capacitor $C_{B2}$, is coupled to a load. In particular, a voltage of the first capacitor $C_{B1}$ is substantially equal to a voltage of the second capacitor $C_{B2}$. In an ideal condition, that is, without considering the ripple voltage, the voltage of the first capacitor $C_{B1}$ is equal to the voltage of the second capacitor $C_{B2}$.

An anode of the third diode $D_{C1}$ is coupled to the node $P_S$, and a cathode of the third diode $D_{C1}$ is coupled to a first end of the third capacitor $C_C$, that is, the cathode of the third diode $D_{C1}$ and the first end of the third capacitor $C_C$ are commonly coupled to a node $P_E$. A second end of the third capacitor $C_C$ is coupled to the negative end of the DC input voltage Vdc. An anode of the fourth diode $D_{C2}$ is coupled to the node $P_E$, and a cathode of the fourth diode $D_{C2}$ is coupled to the cathode of the second diode D2 and the first end of the first capacitor $C_{B1}$. An anode of the fifth diode $D_{C3}$ is coupled to the node $P_C$, and a cathode of the fifth diode $D_{C3}$ is coupled to a first end of the transient voltage suppressor TVS, that is, the fifth diode $D_{C3}$ and the transient voltage suppressor TVS are commonly coupled to a node $P_A$. A second end of the transient voltage suppressor TVS is coupled to the node $P_D$.

It is assumed that the voltage of the first capacitor $C_{B1}$ and the voltage of the second capacitor $C_{B2}$ are 750 volts, respectively, and the voltage (breakdown voltage) of the transient voltage suppressor TVS is selected to be 100 volts. Since the voltage of the flying capacitor $C_{F1}$ is controlled at half of the bus voltage, i.e., at half of the sum of the voltage of the first capacitor $C_{B1}$ and the voltage of the second capacitor $C_{B2}$, the transient voltage suppressor TVS will not be turned on unless the voltage at the node $P_A$ is greater than 850 volts. In particular, the selection of the transient voltage suppressor TVS needs to consider the ripple voltage of the first capacitor $C_{B1}$ and the ripple voltage of the voltage of the second capacitor $C_{B2}$. Therefore, the transient voltage suppressor TVS is used to solve the problem of the withstand voltage of the second diode D2 by a charging path formed by the fifth diode $D_{C3}$, the transient voltage suppressor TVS, the flying capacitor $C_{F1}$, the third diode $D_{C1}$, the third capacitor $C_C$, and the second capacitor $C_{B2}$ when two flying capacitor converters are used in parallel and the DC input voltage Vdc does not supply power. When the flying capacitor converter normally operates, it is to avoid excessive current frequently flowing through the fifth diode $D_{C3}$ due to the charging path formed by the ripples.

Figure 11:
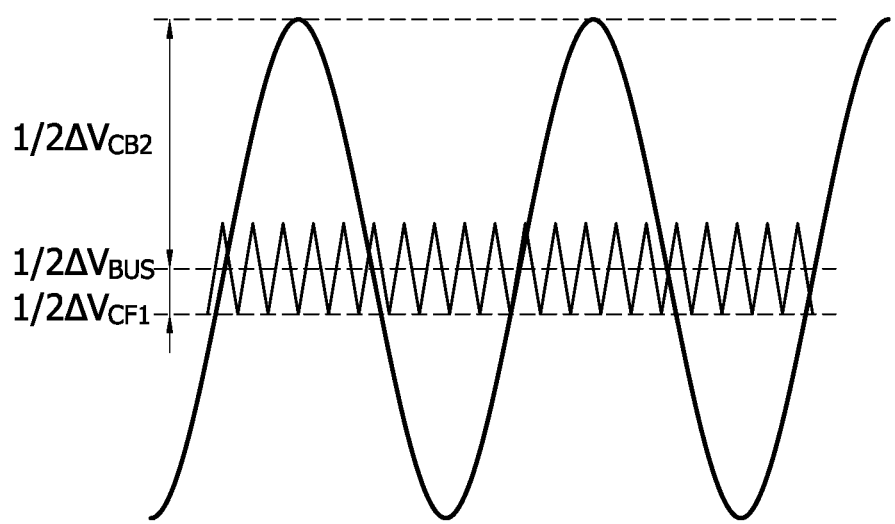
FIG. 11 is a ripple waveform of a bus capacitor according to the present disclosure.

Please refer to FIG. 11, which shows a ripple waveform of a bus capacitor according to the present disclosure. A breakdown voltage of the transient voltage suppressor TVS can be considered (satisfied) according to the following relationship, and also refer to FIG. 4.

$$V_{TVS} > (0.5 \times \Delta VC_{B2} + 0.5 \times \Delta VC_{F1}) \times Coe$$

where, $V_{TVS}$ represents the breakdown voltage of the transient voltage suppressor TVS, $\Delta VC_{B2}$ represents the ripple voltage of the second capacitor $C_{B2}$, $\Delta VC_{F1}$ represents the ripple voltage of the flying capacitor $C_{F1}$, and Coe represents a coefficient value. According to the relationship above, the breakdown voltage of the transient voltage suppressor TVS is at least greater than a difference value between the maximum (peak) ripple voltage of the second capacitor $C_{B2}$ and the minimum (valley) ripple voltage of the flying capacitor $C_{F1}$.

When the first switch S1 and the second switch S2 are controlled to be on/off, theoretically the voltage of the flying capacitor $C_{F1}$ would be close to the voltage of the first capacitor $C_{B1}$ and the voltage of the second capacitor $C_{B2}$. Due to the ripple on the capacitor, actually the voltage of the second capacitor $C_{B2}$ may be greater than the voltage of the flying capacitor $C_{F1}$. At this condition, a current flowing through the second capacitor $C_{B2}$, the fifth diode $D_{C3}$, the flying capacitor $C_{F1}$, the second switch S2, and the second capacitor $C_{B2}$ easily causes damage to the fifth diode $D_{C3}$. Therefore, the transient voltage suppressor TVS having an appropriate breakdown voltage can be added to protect the fifth diode $D_{C3}$.

Figure 10:
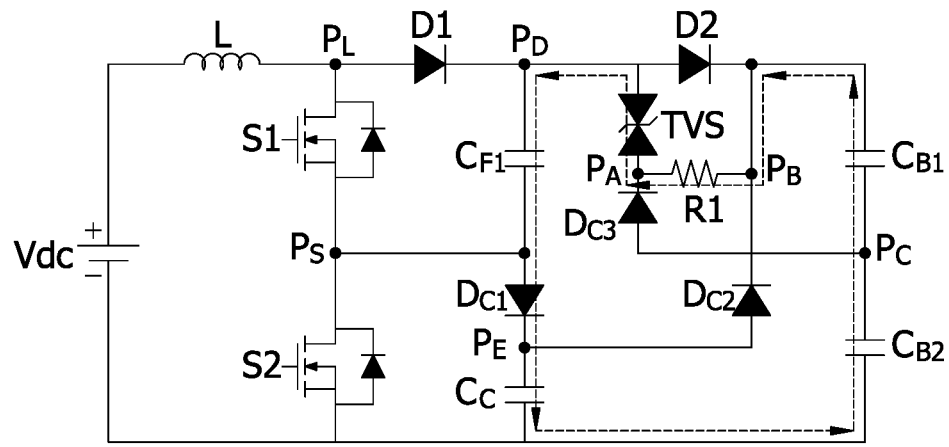
FIG. 10 is a circuit diagram of the flying capacitor converter according to a second preferred embodiment of the present disclosure.

Please refer to FIG. 10, which shows a circuit diagram of the flying capacitor converter according to a second preferred embodiment of the present disclosure. The FCC further a first resistor R1. The first resistor R1 is coupled between the node $P_A$ and a node $P_B$. The node $P_B$ is a common node of the second diode D2 and the fourth diode $D_{C2}$. The effect of the first resistor R1 is to charge the flying capacitor $C_{F1}$ and the third capacitor $C_C$ by a current path shown in FIG. 10 when the first capacitor $C_{B1}$ and the second capacitor $C_{B2}$ can provide electrical energy but the DC input voltage Vdc fails to supply power. In particular, since the current path is independent of the second capacitor $C_{B2}$, the fifth diode $D_{C3}$, and the transient voltage suppressor TVS, the damage of the fifth diode $D_{C3}$ can be avoided.

Although the present disclosure has been described with reference to the preferred embodiment thereof, it will be understood that the present disclosure is not limited to the details thereof. Various substitutions and modifications have been suggested in the foregoing description, and others will occur to those of ordinary skill in the art. Therefore, all such substitutions and modifications are intended to be embraced within the scope of the present disclosure as defined in the appended claims.

What is claimed is:

1. A flying capacitor converter configured to receive a DC input voltage and convert the DC input voltage into a DC output voltage, the flying capacitor converter comprising:

an inductor coupled between a positive end of the DC input voltage and a first node, a first switch and a second switch commonly coupled to a second node, and the first switch coupled to the first node and the second switch coupled to a negative end of the DC input voltage, a first diode and a second diode commonly coupled to a third node, and the first diode coupled to the first node, a first capacitor and a second capacitor commonly coupled to a fourth node, and the first capacitor coupled to the second diode and the second capacitor coupled to the second switch and the negative end of the DC input voltage, wherein the first capacitor and the second capacitor are configured to provide the DC output voltage, and the fourth node is a midpoint of the DC output voltage, a flying capacitor coupled to the second node and the third node, a third diode and a third capacitor commonly coupled to a fifth node, and the third diode coupled to the second node and the third capacitor coupled to the second switch and the negative end of the DC input voltage, a fourth diode coupled to the second diode and the fifth node, a fifth diode coupled to the third node and the fourth node, and a voltage suppressor coupled in series to the fifth diode, and the voltage suppressor and the fifth diode coupled between the third node and the fourth node.

2. The flying capacitor converter in claim 1, wherein the voltage suppressor and the fifth diode are commonly coupled to a sixth node, and the voltage suppressor is coupled to the third node and the fifth diode is coupled to the fourth node.

3. The flying capacitor converter in claim 2, further comprising:

a first resistor coupled between the sixth node and a seventh node, wherein the seventh node is a common node of the second diode and the fourth diode.

4. The flying capacitor converter in claim 1, wherein when the DC input voltage initially supplies power, the first switch and the second switch are turned off, and the DC input voltage charges the first capacitor and the second capacitor and charges the flying capacitor and the third capacitor so that a voltage ratio between the first switch and the second switch is substantially equal to a voltage ratio between the flying capacitor and the third capacitor.

5. The flying capacitor converter in claim 1, wherein an output of the flying capacitor converter is coupled to an output of a second flying capacitor converter, and the second flying capacitor converter is configured to convert a second DC input voltage into a second DC output voltage.

6. The flying capacitor converter in claim 1, wherein a breakdown voltage of the voltage suppressor is greater than a difference between a maximum ripple voltage of the second capacitor and a minimum ripple voltage of the flying capacitor.

7. The flying capacitor converter in claim 1, wherein at a predetermined time before the flying capacitor converter actives, the flying capacitor converter provides a control signal with an extremely small duty cycle to the second switch so that the flying capacitor is slowly charged.

8. The flying capacitor converter in claim 1, wherein the voltage suppressor is a transient voltage suppressor or a Zener diode.

* * * * *